United States Patent
Kwon et al.

(10) Patent No.: US 7,588,700 B2
(45) Date of Patent: Sep. 15, 2009

(54) ELECTROMAGNETIC SHIELDING MATERIAL HAVING CARBON NANOTUBE AND METAL AS ELECTRICAL CONDUCTOR

(75) Inventors: Jong-Hwa Kwon, Daejon (KR); Hyung-Do Choi, Seoul (KR); Ho-Gyu Yoon, Seoul (KR); Yoon-Jin Kim, Busan (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 348 days.

(21) Appl. No.: 10/575,343

(22) PCT Filed: Oct. 15, 2004

(86) PCT No.: PCT/KR2004/002655

§ 371 (c)(1),
(2), (4) Date: Apr. 11, 2006

(87) PCT Pub. No.: WO2005/038824

PCT Pub. Date: Apr. 28, 2005

(65) Prior Publication Data

US 2007/0018142 A1   Jan. 25, 2007

(30) Foreign Application Priority Data

Oct. 16, 2003   (KR) .................. 10-2003-0072074

(51) Int. Cl.
*H01B 1/24* (2006.01)

(52) U.S. Cl. .................. 252/503; 250/515.1; 524/495

(58) Field of Classification Search .............. 252/503, 252/511, 512–514; 250/515.1; 524/495–196, 524/496

See application file for complete search history.

(56) References Cited

U.S. PATENT DOCUMENTS

| | | | |
|---|---|---|---|
| 5,883,603 A | 3/1999 | Kim | |
| 6,184,280 B1 | 2/2001 | Shibuta | |
| 6,528,572 B1 * | 3/2003 | Patel et al. | 524/495 |
| 6,667,716 B2 | 12/2003 | Chen | |
| 6,717,548 B2 | 4/2004 | Chen | |
| 6,988,925 B2 * | 1/2006 | Arthur et al. | 445/46 |
| 7,118,693 B2 * | 10/2006 | Glatkowski et al. | 252/502 |
| 2003/0038749 A1 | 2/2003 | Chen | |
| 2004/0028859 A1 * | 2/2004 | LeGrande et al. | 428/36.91 |

FOREIGN PATENT DOCUMENTS

| | | |
|---|---|---|
| JP | 2001-267782 | 9/2001 |
| JP | 2002-290094 | 10/2002 |
| KR | 1020020038035 | 5/2002 |
| KR | 1020030019527 | 3/2003 |
| KR | 2006039277 A * | 5/2006 |

OTHER PUBLICATIONS

English translation of JP2002-290094 (Apr. 10, 2002).*

(Continued)

*Primary Examiner*—Mark Kopec
(74) *Attorney, Agent, or Firm*—Lowe Hauptman Ham & Berner, LLP

(57) ABSTRACT

Disclosed is an electromagnetic shielding material with enhanced shielding effectiveness and mechanical property by employing a carbon nanotube and a metal as an electrical conductor. The electromagnetic shielding material includes a polymer resin for a matrix and two conductive fillers having a carbon nanotube and a metal, wherein a volume percent of the carbon nanotube ranges about 0.2% to about 10% and a volume percent of the metal powder ranges about 7.0% to about 30% so that the total volume percent of the conductive filler is in a range of about 7.2% to about 40%.

6 Claims, 1 Drawing Sheet

OTHER PUBLICATIONS

C.Y. Lee et al.; "Electromagnetic interference shielding efficiency of polyaniline mixtures and multilayer films"; Synthetic Metals 102; 1999; pp. 1346-1349.

Yoon Jin Kim et al.; "Electrical conductivity of chemically modified multiwalled carbon nanotube/epoxy composites"; Elsevier Carbon 43; 2005; pp. 23-30; Seokyeong University.

* cited by examiner

ELECTROMAGNETIC SHIELDING MATERIAL HAVING CARBON NANOTUBE AND METAL AS ELECTRICAL CONDUCTOR

CROSS REFERENCE TO RELATED APPLICATION

This application is the National Phase application of International Application No. PCT/KR2004/002655, filed Oct. 15, 2004, which designates the United States and was published in English. This application, in its entirety, is incorporated herein by reference.

TECHNICAL FIELD

The present invention relates to an electromagnetic shielding material; more particularly to an electromagnetic shielding material with enhanced electromagnetic shielding effectiveness by employing a carbon nanotube and a metal powder therein as an electrical conductor.

BACKGROUND ART

Electromagnetic waves can cause malfunctions in some electronic devices. More importantly negative influence on the health of human beings is also suspected. Therefore, most of countries regulate an electromagnetic interference and resistance according to an international standard, i.e., an International Special Committee on Radio Interference (CISPR) of an International Electrotechnical Commission (IEC) and an Electromagnetic Compatibility (EMC). Therefore, in order to sell various electronic devices, the electronic devices should meet the regulation for the electromagnetic waves.

To protect the electronic devices and rooms interiors from the electromagnetic waves, an electromagnetic shielding material is mainly used. The electromagnetic material for the aforementioned purpose should possess good electric conductivity to minimize the penetration of the electromagnetic waves into the material and low magnetic permeability to convert magnetic energy into heat.

The prior art electromagnetic shielding material is typically manufactured by dispersing a metal powder or a carbon nanotube with high electrical conductivity into a polymer such as silicon rubber, polyurethane, polycarbonate and epoxy resin, wherein a volume percent of the metal powder or the carbon nanotube is higher than 30%. Herein, the metal powder uses mainly a silver powder or a silver-coated copper powder which has high electrical conductivity. When the silver powder over 30 volume % is dispersed into the polymer, it is possible to obtain the electromagnetic shielding material having a volume resistivity less than 0.01 ohm-cm and an electromagnetic shielding effectiveness of about 50 dB.

In recent years, however, there is still required for the electromagnetic shielding material having much more enhanced volume resistivity and electromagnetic shielding effectiveness, to meet the rigid regulation of the electromagnetic shielding interference. To solve the above problem, lots of metal powders such as silver powders are dispersed into the polymer. However, as metal powders are dispersed more and more into the polymer, mechanical property such as impact strength becomes deteriorated while the electromagnetic shielding effectiveness becomes enhanced. Thus, it is difficult to manufacture the electromagnetic shielding material stably when large amount of the metal powder is dispersed in the polymer.

Meanwhile, since the carbon nanotube has been developed by S. Iijima, disclosed in Nature Vol. 354, page 56, published in 1991, various researches for the carbon nanotube has been advanced up to date. The carbon nanotube has advantageous merits as followings in comparison with the other conventional materials; it has high elastic coefficient ranging from about 1.0 MPa to about 1.8 MPa; it has an enhanced heat resistant property to endure at 2,800° C. in vacuum state; its heat conductivity is two times to that of a diamond; and its current transferring capability is about 1,000 times to that of copper. Therefore, the carbon nanotube is widely applied to a nano-scaled electric/electronic device, a nano-sensor, a photoelectric device and a high-functional composite. In case of applying the carbon nanotube to the electromagnetic shielding, it is possible to obtain the electromagnetic shielding material with low volume resistivity like a semiconductor in case of dispersing the carbon nanotube beyond 0.04 volume % into the polymer, because small amount of the carbon nanotube renders a conductive network formed in the polymer.

However, the prior art electromagnetic shielding material has a shortcoming that it is difficult to obtain a desired electromagnetic shielding effectiveness. That is, though there are much more carbon nanotube dispersed into the polymer, the electromagnetic shielding material shows relatively high volume resistivity, i.e., about 10 ohm-cm and poor shielding effectiveness. Moreover, it is hard to disperse even small amount of the carbon nanotube into the polymer so that there is a limitation to apply it to the electromagnetic shielding material.

DISCLOSURE OF THE INVENTION

It is, therefore, an object of the present invention to provide an electromagnetic shielding material with an enhanced property by employing a carbon nanotube and a metal powder as an electrical conductor.

In accordance with the present invention, there is provided an electromagnetic shielding material comprising: a polymer resin for a matrix; and a conductive filler including a carbon nanotube and a metal.

BRIEF DESCRIPTION OF THE DRAWINGS

Other objects and aspects of the invention will become apparent from the following description of the embodiments with reference to the accompanying drawings, in which.

BEST MODE FOR CARRYING OUT THE INVENTION

Hereinafter, an electromagnetic shielding material in accordance with a preferred embodiment of the present invention will be described in detail with reference to the accompanying drawings.

Figure 1:
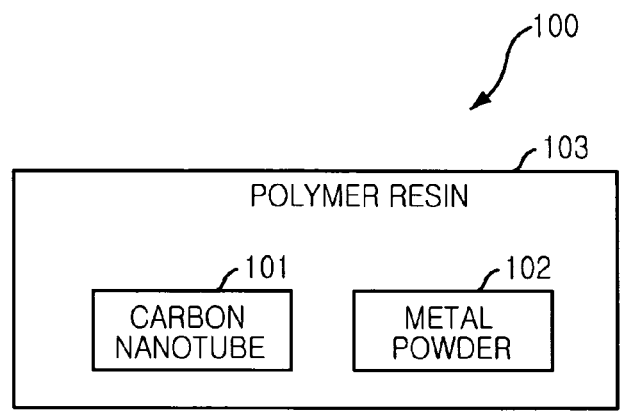
FIG. 1 is a schematic conceptual scheme setting forth composition of an electromagnetic shielding material in accordance with a preferred embodiment of the present invention.

FIG. 1 shows a composite of the electromagnetic shielding material in accordance with the present invention.

Referring to FIG. 1, the inventive electromagnetic shielding material includes a matrix of a polymer resin 103 and a conductive filler having a metal powder 102 and a carbon nanotube 101. Herein, a volume percent of the carbon nanotube ranges from about 0.2% to about 10% and the metal powder is dispersed in the polymer resin 103 with a volume percent in a range of about 7.0% to about 30%. In this case, it is noted that a total volume percent of the conductive filler should be in the range of about 7.2% to about 40%.

To begin with, polymer which can compound the carbon nanotube 101 and the metal powder 102 can be used for the polymer resin 103 regardless of its molecular weight, density, molecular structure and functional group. For instance, the polymer resin 103 may employ a general-purpose polymer such as silicon rubber, polyurethane, polycarbonate, polyacetate, polymethyl methacrylate, polyvinyl alcohol, Acrylonitrile-Butadiene-Styrene terpolymer (ABS) or the like. In addition, functional thermosetting resin such as epoxy, polyimide or the like may also be utilized for the polymer resin 103. Furthermore, polymer material obtained through blending of the aforementioned polymers can also be used for the polymer resin 103. However, in case of requiring high thermal resistance and high resistance against mechanical impact strength, silicon rubber or poly-urethane is more adequate for the polymer resin 103.

In general, the carbon nanotube 101 is manufactured by a predetermined method selected from the group consisting of a chemical vapor deposition, an arc discharge, a plasma torch and an ion impact, wherein the carbon nanotube has a single-walled nanotube (SWNT) or a multi-walled nanotube (MWNT). Typically, in order to enhance a dispersion property of the carbon nanotube 101 in the polymer resin 103, a predetermined process should be carried out such as a refining process by acid or a reforming process by fluorine gas. But, in the present invention, the carbon nanotube 101 can be utilized for the conductive filler without carrying out the refining process or the reforming process.

From the result of a Fourier Transform Infrared (FT-IR) spectroscopy, it is understood that the carbon nanotube 101 of the present invention is preferably selected from the group consisting of a nanotube having a phenyl-carbonyl C—C stretch bonding peak existing between about 1,300 cm$^{-1}$ and about 1,100 cm$^{-1}$, a nanotube having a phenyl-carbonyl C—C stretch bonding peak existing between about 1,300 cm$^{-1}$ and about 1,100 cm$^{-1}$, a carbonic C—C stretch bonding peak existing between about 1,570 cm$^{-1}$ and about 1,430 cm$^{-1}$ and a carboxylic C=O stretch vibration peak existing at about 1,650 cm$^{-1}$, a nanotube having a phenyl-carbonyl C—C stretch bonding peak existing between about 1,300 cm$^{-1}$ and about 1,100 cm$^{-1}$, a carboxyl C=O stretch vibration peak existing at about 1,650 cm$^{-1}$ and an —OH bonding peak existing at about 3,550 cm$^{-1}$, a nanotube having a C—F bonding peak existing at about 1,250 cm$^{-1}$ and a combination thereof. In case of not using the carbon nanotube aforementioned, the dispersion property and the electrical conductivity of the carbon nanotube may be deteriorated so as to have a bad effect on an electromagnetic shielding effectiveness. Furthermore, in this case, the carbon nanotube has a bad interaction between the metal powders 102 so that the electromagnetic shielding effectiveness may become poor.

In the present invention, the carbon nanotube 101 has at least 0.2 volume % with respect to the whole composite. Preferably, the volume percent of the carbon nanotube should be in the range of about 0.2% to about 10%. Provided that the volume percent of the carbon nanotube is lower than about 0.2%, the interaction between the carbon nanotube 101 and the powder metal 102 is too bad so that the electromagnetic shielding material does not have a desired electrical conductivity. On the other hand, if the volume percent of the carbon nanotube 101 is higher than about 10%, the electrical conductivity can be increased but the dispersion property may be worsened, whereby it has a difficulty for milling and forming the electromagnetic shielding material.

The metal powder 102 for use in the present invention may employ a conventional metal powder such as a silver powder, silver-coated copper or the like. However, a predetermined conductive fiber can be used instead of the metal powder 102, e.g., a steel fiber, a copper fiber, an aluminum fiber, a nickel fiber and so forth. Herein, the metal powder 102 has such a characteristic that the electrical conductivity should be higher than about 10$^5$ S/cm and the volume percent should be higher than about 7.0%. If the volume percent of the metal powder 102 is lower than about 7.0%, the electrical conductivity may be decreased and the electromagnetic shielding effectiveness may be deteriorated because there is not enough percolation by means of the interaction between the metal powder 102 and the carbon nanotube 101. Therefore, in the present invention, the volume percent of the metal powder 102 should be preferably in the range of about 7.0% to about 30% in consideration of high mechanical shock resistance of the polymer resin 103, a density of the electromagnetic shielding material and formability.

The inventive electromagnetic shielding material may further include a positive ionic dispersing agent, a negative ionic dispersing agent or a non-ionic dispersing agent for achieving an enhanced dispersion property. In addition, if necessary, there is introduced a silane-coupling agent such as an epoxy, carboxyl, amine or the like and a compatibilizer which may be required in case of blending at least two kinds of polymer resin.

A method for manufacturing the electromagnetic shielding material in accordance with the present invention will be described hereinafter.

The method for manufacturing the inventive electromagnetic shielding material begins with preparing a raw material, i.e., the carbon nanotube 101, the metal powder 102 and the polymer resin 103. Thereafter, the raw material is mixed in a mixer such as a Henshel mixer, a Lodige mixer, a homgenizer or the like. Subsequently, a mixture of the carbon nanotube 101, the metal powder 102 and the polymer epoxy 103 are melted and kneaded by means of a two roll mill or a kneader and then the kneaded mixture is cooled to thereby obtain the electromagnetic shielding material. Herein, to facilitate the mixing process, a solvent which can dissolve the polymer resin 103 may be utilized such as methyl ethyl ketone, alcohol, isoprophyl alcohol, toluene or a combination thereof. It is noted that the solvent should not exist in a final product, i.e., the electromagnetic shielding material. Thus, the solvent remaining in the product should be removed during a predetermined manufacturing process. By using the solvent, it is possible to manufacture the electromagnetic shielding material with various shapes such as a bulk type, a coating type and a spray type.

An experimental result and an example for the present invention will be set forth in detail with reference to the accompanying tables 1 to 3.

In table 1, there is shown a volume resistivity and an electromagnetic shielding efficiency measured in the experiment. Specimens used in the experiment are provided by following steps. To begin with, after weighting each material described in table 1, polyurethane is dispersed in methyl ethyl ketone solvent, wherein a volume ratio of the polyurethane and the methyl ethyl ketone is 1 to 6. Subsequently, a predetermined amount of the carbon nanotube is stirred for about 30 minutes with nitric acid diluted with a mixing ratio of 1 to 3 and an aqueous solution with 25 wt % of sulfuric acid and then acid aqueous solution is removed. The carbon nanotube and a silver powder are added into a solution mixed with polyurethane and methyl ethyl ketone. Thereafter, a solution mixed with the polyurethane, the carbon nanotube, the silver powder and the methyl ethyl ketone is stirred and is ultrasonically treated. Then, after the methyl ethyl ketone solvent is removed, the two roll mill process is carried out to thereby obtain a conductive composite.

TABLE 1

|  | Specimen #1 | Specimen #2 | Specimen #3 | Specimen #4 |
|---|---|---|---|---|
| Polyurethane (Vol. %) | 92.8 | 91.8 | 89.8 | 89.4 |
| Carbon nanotube (Vol. %) | 0.2 | 0.2 | 0.2 | 0.6 |
| Silver powder (Vol. %) | 7.0 | 8.0 | 10.0 | 10.0 |
| Volume resistivity ($10^{-3}$ ohm-cm) | 385.8 | 165.5 | 80.3 | 36.2 |
| Electromagnetic shielding effectiveness (dB) | 39.4 | 49.0 | 55.3 | 63.4 |

Figure 2:
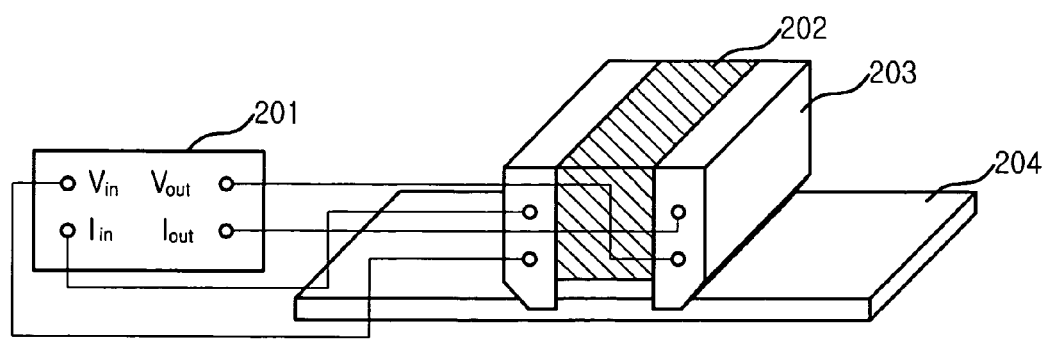
FIG. 2 is a perspective view illustrating an apparatus for measuring surface resistivity of the electromagnetic shielding material in accordance with the present invention.

Herein, the volume resistivity is measured by means of measuring apparatus, e.g., MIL-G-835288™ which is depicted in FIG. 2 and an ohmmeter for measuring low resistance, e.g., 3,450 mΩ Hi-tester™. The detail description for the MIL-G-835288™ will be illustrated later. Each specimen #1 to #4 is provided with a shape having a rectangular parallelepiped of 25.4 mm×35.0 mm×0.5 mm. To find out volume resistivity, first of all, a surface resistivity (Ω/square) is measured and then the surface resistivity is converted to the volume resistivity (ohm-cm).

Referring to FIG. 2, there is shown a perspective view setting forth the MIL-G-835288™ apparatus for measuring the surface resistivity.

In FIG. 2, input/output terminals of an external measuring apparatus 201 are connected with a 4-terminal measuring probe having an insulator 202 and a silver plated brass 203. Beneath the probe, there is disposed a gasket sample 204, i.e., a specimen. Herein, it is possible to measure the surface resistivity in case that the specimen has a predetermined size over than 1.4 inches×1 inch. The measured data is displayed at a liquid crystal display (LCD). Finally, the surface resistivity is multiplied by a thickness of the specimen to thereby evaluate the volume resistivity.

Meanwhile, the electromagnetic shielding effectiveness can be measured within the range of about 50 MHz to about 6 GHz by using a network analyzer, e.g., Agilent 8722ES™, according to an ASTM D4935-89 specification and a 2-port flanged coaxial holder, wherein the specimen used in the experiment has a diameter of about 133.0 mm. The shielding effectiveness is evaluated by using $S_{21}$ parameter after measuring an s-parameter and a return loss is evaluated by using $S_{11}$ parameter. Herein, $S_{21}$ parameter means a transmission amount of an incident electromagnetic wave and is used for estimating the electromagnetic shielding effectiveness.

Referring to table 1, in the electromagnetic shielding material of each specimen, the volume percent of the carbon nanotube is increased from 0.2% to 0.6% and that of the silver powder is increased from 7.0% to 10%. From table 1, it is understood that the volume resistivity is decreased and the electromagnetic shielding effectiveness is increased if the volume percent of the carbon nanotube is higher than about 0.2% and that of the silver powder is higher than about 7.0%.

Table 2 shows another experimental data of the volume resistivity and the shielding effectiveness for each specimen in case of dispersing the carbon nanotube in methyl ethyl ketone solution without any acid treatment in accordance with the present invention. In table 2, since a preparation of each specimen is same to the preparation step described in the experiment of table 1, further description for the specimen will be omitted herein.

TABLE 2

|  | Specimen #5 | Specimen #6 | Specimen #7 | Specimen #8 |
|---|---|---|---|---|
| Polyurethane (Vol. %) | 89.8 | 89.4 | 89.0 | 78.0 |
| Carbon nanotube (Vol. %) | 0.2 | 0.6 | 1.0 | 2.0 |
| Silver-coated copper powder (Vol. %) | 10.0 | 10.0 | 10.0 | 20. |
| Volume resistivity ($10^{-3}$ ohm-cm) | 120.7 | 75.7 | 35.4 | 3.7 |
| Electromagnetic shielding efficiency (dB) | 51.2 | 55.9 | 63.7 | 86.5 |

In comparison with the experimental result of table 1, the experiment of table 2 employs the silver-coated copper powder instead of the silver powder and the other experimental conditions are similar to the experiment of table 1. From tables 1 and 2, the inventive electromagnetic shielding material having a mixture of the carbon nanotube and the metal powder represents low volume resistivity and high shielding effectiveness in case of employing the carbon nanotube and the metal powder beyond 0.2 volume % and 7.0 volume %, respectively.

Referring to table 3, there are further another experimental data for specimens having one conductive filler or two conductive fillers in which each volume percent of the carbon nanotube and the metal powder is out of the range of the inventive electromagnetic shielding material.

TABLE 3

|  | Specimen #9 | Specimen #10 | Specimen #11 | Specimen #12 | Specimen #13 |
|---|---|---|---|---|---|
| Silicon rubber | 98.0 | 92.5 | 85.0 | 93.9 | 70.0 |
| Carbon nanotube | 2.0 | 7.5 | 15.0 | 0.1 | 0 |
| Silver powder | 0 | 0 | 0 | 6.0 | 30.0 |
| Vol. resistivity ($10^{-3}$ ohm-cm) | 58.3 | 0.783 | Cannot be fabricated | 32.2 | 0.0365 |
| Electromagnetic shielding efficiency (dB) | 0 | 5 |  | 0 | 63 |

From table 3, if the electromagnetic shielding material constitutes with the silicon rubber and the carbon nanotube like the specimens #9 and #11, the volume resistivity is very high and the shielding effectiveness is very low. Additionally, even though the electromagnetic shielding material has two conductive fillers of the carbon nanotube and the silver powder, it shows poor volume resistivity and shielding effectiveness in case that the volume percent of the carbon nanotube and that of the silver powder are below 0.2% and beyond 30.0%, respectively. In particular, if the electromagnetic shielding material is manufactured by using the carbon nanotube only, the experimental data shows that the shielding effectiveness is extremely low. Moreover, provided that the carbon nanotube exceeds to about 10 volume %, e.g., 15 volume % like the specimen #11, the dispersion property is too deteriorated so that it is impossible to fabricate the electromagnetic shielding material. Even though the electromagnetic shielding material shows good shielding effectiveness in case of filling the silver powder more than 30% in the silicon rubber, it is difficult to obtain the electromagnetic shielding material with high mechanical shock resistance, light-weight material and cost-effective material comparing with the present invention.

As described already, since the present invention employs two conductive fillers concurrently, i.e., the carbon nanotube and the metal powder, it is possible to obtain the electromagnetic shielding material with an enhanced shielding effectiveness and a physical/mechanical property. That is, the metal powder 102 in the polymer resin 103 is relatively small in comparison with the prior art electromagnetic shielding material so that the large amount of the polymer resin 103 provides good mechanical property, i.e., high resistance against the mechanical shock. In addition, the present invention provides an advantageous merit that small amount of the metal powder makes a manufacturing cost reduced and the weight of the shielding material lightened. Furthermore, the inventive electromagnetic shielding material has another advantage that it has an enhanced property for heat radiation because the carbon nanotube and the metal powder have good electrical conductivity.

The present application contains subject matter related to the Korean patent application No. KR 2003-72074, filed in the Korean Patent Office on Oct. 16, 2003, the entire contents of which being incorporated herein by reference.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electromagnetic shielding material comprising:
a polymer resin for a matrix; and
a conductive filler including a carbon nanotube and a metal, wherein the carbon nanotube is a nanotube having a phenyl-carbonyl C—C stretch bonding peak existing between about 1,300 cm$^{-1}$ and about 1,100 cm$^{-1}$, a carboxyl C=O stretch vibration peak existing at about 1,650 cm$^{-1}$ and a N—H stretch peak existing at about 3,550 cm$^{-1}$ and
wherein the polymer resin is a thermosetting resin selected from the group consisting of epoxy, polyimide and a combination thereof.

2. The electromagnetic shielding material as recited in claim 1, wherein a volume percent of the carbon nanotube ranges from about 0.2% to about 10% and a volume percent of the metal powder ranges from about 7.0% to about 30% so that the total volume percent of the conductive filler is in a range of about 7.2% to about 40%.

3. The electromagnetic shielding material as recited in claim 1, wherein the carbon nanotube employs a single-walled carbon nanotube or a multi-walled carbon nanotube.

4. The electromagnetic shielding material as recited in claim 3, wherein the carbon nanotube is manufactured by a method selected from the group consisting of a chemical vapor deposition, an arc discharge, a plasma torch and an ion impact.

5. The electromagnetic shielding material as recited in claim 1, wherein electrical conductivity of the metal is higher than 10$^5$ S/cm.

6. The electromagnetic shielding material as recited in claim 5, wherein the metal is a material selected from the group consisting of a silver powder, a silver-coated copper powder, a steel fiber, a copper fiber, an aluminum fiber and a nickel fiber.

* * * * *